(12) United States Patent
Chien et al.

(10) Patent No.: US 11,883,939 B2
(45) Date of Patent: Jan. 30, 2024

(54) HEAT DISSIPATING DEVICE AND ELECTRIC NAIL GUN HAVING THE SAME

(71) Applicant: BASSO INDUSTRY CORP., Taichung (TW)

(72) Inventors: Chia-Yu Chien, Taichung (TW); Jian-Rung Wu, Taichung (TW)

(73) Assignee: Basso Industry Corp., Taichung (TW)

( * ) Notice: Subject to any disclaimer, the term of this patent is extended or adjusted under 35 U.S.C. 154(b) by 454 days.

(21) Appl. No.: 17/160,466

(22) Filed: Jan. 28, 2021

(65) Prior Publication Data

US 2021/0237246 A1   Aug. 5, 2021

(30) Foreign Application Priority Data

Jan. 31, 2020   (TW) .................................. 109201139

(51) Int. Cl.
B25C 1/06 (2006.01)
B25F 5/00 (2006.01)
H05K 7/20 (2006.01)

(52) U.S. Cl.
CPC ............... B25C 1/06 (2013.01); B25F 5/008 (2013.01); H05K 7/20154 (2013.01); H05K 7/20172 (2013.01)

(58) Field of Classification Search
CPC ....... B25C 1/06; B25F 5/008; H05K 7/20154; H05K 7/20172
See application file for complete search history.

(56) References Cited

U.S. PATENT DOCUMENTS

| | | | |
|---|---|---|---|
| 8,511,532 B2* | 8/2013 | Chien | B25C 1/06 227/120 |
| 8,695,862 B2* | 4/2014 | Wu | B25C 1/08 173/162.1 |
| 11,370,095 B2* | 6/2022 | Chien | B25C 1/06 |
| 2002/0070008 A1* | 6/2002 | Chen | F04D 25/0613 165/80.3 |
| 2010/0122683 A1* | 5/2010 | Kawana | F02B 63/02 123/195 C |
| 2015/0034345 A1* | 2/2015 | Po | B25C 1/06 173/46 |
| 2016/0181891 A1* | 6/2016 | Fogle | H02K 11/215 310/43 |
| 2019/0314968 A1* | 10/2019 | Bailey | B25C 1/047 |
| 2020/0246951 A1* | 8/2020 | Chien | B25C 1/06 |
| 2021/0299839 A1* | 9/2021 | Furusawa | B25D 11/12 |

* cited by examiner

Primary Examiner — Thomas M Wittenschlaeger
Assistant Examiner — Katie L Gerth
(74) Attorney, Agent, or Firm — Burris Law, PLLC

(57) ABSTRACT

A heat dissipating device is adapted to be mounted in an electric nail gun that includes a flywheel being rotatable about an axis, a first pulley being spaced apart from the flywheel, and a transmission belt being trained on the first pulley. The heat dissipating device includes a second pulley, a weight disc and a heat dissipating member that are adapted to be connected coaxially and co-rotatably to the flywheel. The second pulley is adapted to be trained by the transmission belt. The heat dissipating member includes a plurality of fan blades extending in a direction of the axis such that, during co-rotation of the flywheel, the weight disc and the heat dissipating member, the fan blades create a flow of air for cooling.

14 Claims, 5 Drawing Sheets

HEAT DISSIPATING DEVICE AND ELECTRIC NAIL GUN HAVING THE SAME

CROSS-REFERENCE TO RELATED APPLICATION

This application claims priority of Taiwanese Patent Application No. 109201139, filed on Jan. 31, 2020.

FIELD

The disclosure relates to a nail gun, and more particularly to a heat dissipating device and an electric nail gun having the same.

BACKGROUND

A conventional electric nail gun includes a flywheel that is rotatable for actuating a nailing process, and a pulley that transmits power to drive rotation of the flywheel. For the purpose of heat dissipation, the pulley of such conventional electric nail gun is formed with a plurality of fan blades. The fan blades are arranged angularly around the pulley, and each of the fan blades extends radially and outwardly from the pulley. During the nailing process, the fan blades create a flow of air to dissipate heat generated by high-speed rotation of the flywheel.

However, since the fan blades occupy a significant amount of space around the pulley, if a need to add a weight disc around the pulley arises in order to increase output power of the conventional electric nail gun, there is not enough space for the addition of the weight disc.

SUMMARY

Therefore, the object of the disclosure is to provide a heat dissipating device and an electric nail gun having the same that can alleviate the drawback of the prior art.

According to a first aspect of the disclosure, a heat dissipating device is adapted to be mounted in an electric nail gun. The electric nail gun includes a main frame, a flywheel that is mounted to the main frame and that is rotatable about an axis, a first pulley that is rotatably mounted to the main frame and that is spaced apart from the flywheel, and a transmission belt that is trained on the first pulley. The heat dissipating device includes a second pulley, a weight disc and a heat dissipating member. The second pulley is adapted to be connected coaxially and co-rotatably to the flywheel, and is adapted to be trained by the transmission belt such that the second pulley is adapted to be driven rotatably by the first pulley to thereby drive rotation of the flywheel about the axis. The weight disc is adapted to be connected coaxially and co-rotatably to the second pulley. The heat dissipating member is connected coaxially and co-rotatably to the weight disc, and includes a plurality of fan blades. Each of the fan blades extends in a direction of the axis such that, during co-rotation of the flywheel, the weight disc and the heat dissipating member, the fan blades create a flow of air for cooling the flywheel.

According to a second aspect of the disclosure, an electric nail gun includes a main frame, a flywheel that is mounted to the main frame and that is rotatable about an axis, a first pulley that is rotatably mounted to the main frame and that is spaced apart from the flywheel, a transmission belt that is trained on the first pulley, and a heat dissipating device as mentioned above that is connected between the transmission belt and the flywheel.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
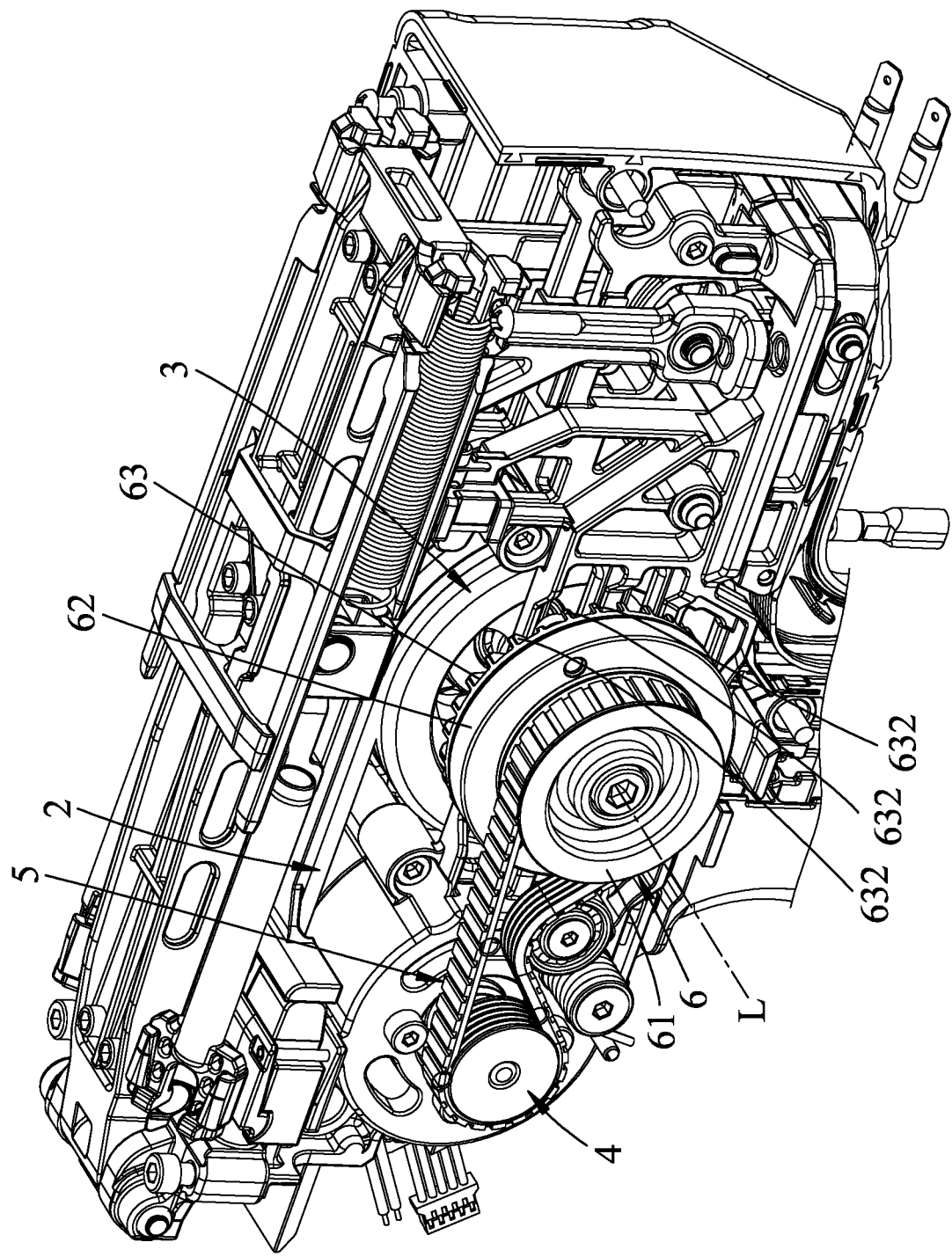
FIG. 1 is a fragmentary perspective view of an embodiment of an electric nail gun according to the disclosure.

Before the present disclosure is described in greater detail, it should be noted that where considered appropriate, reference numerals or terminal portions of reference numerals have been repeated among the figures to indicate corresponding or analogous elements, which may optionally have similar characteristics.

Figure 2:
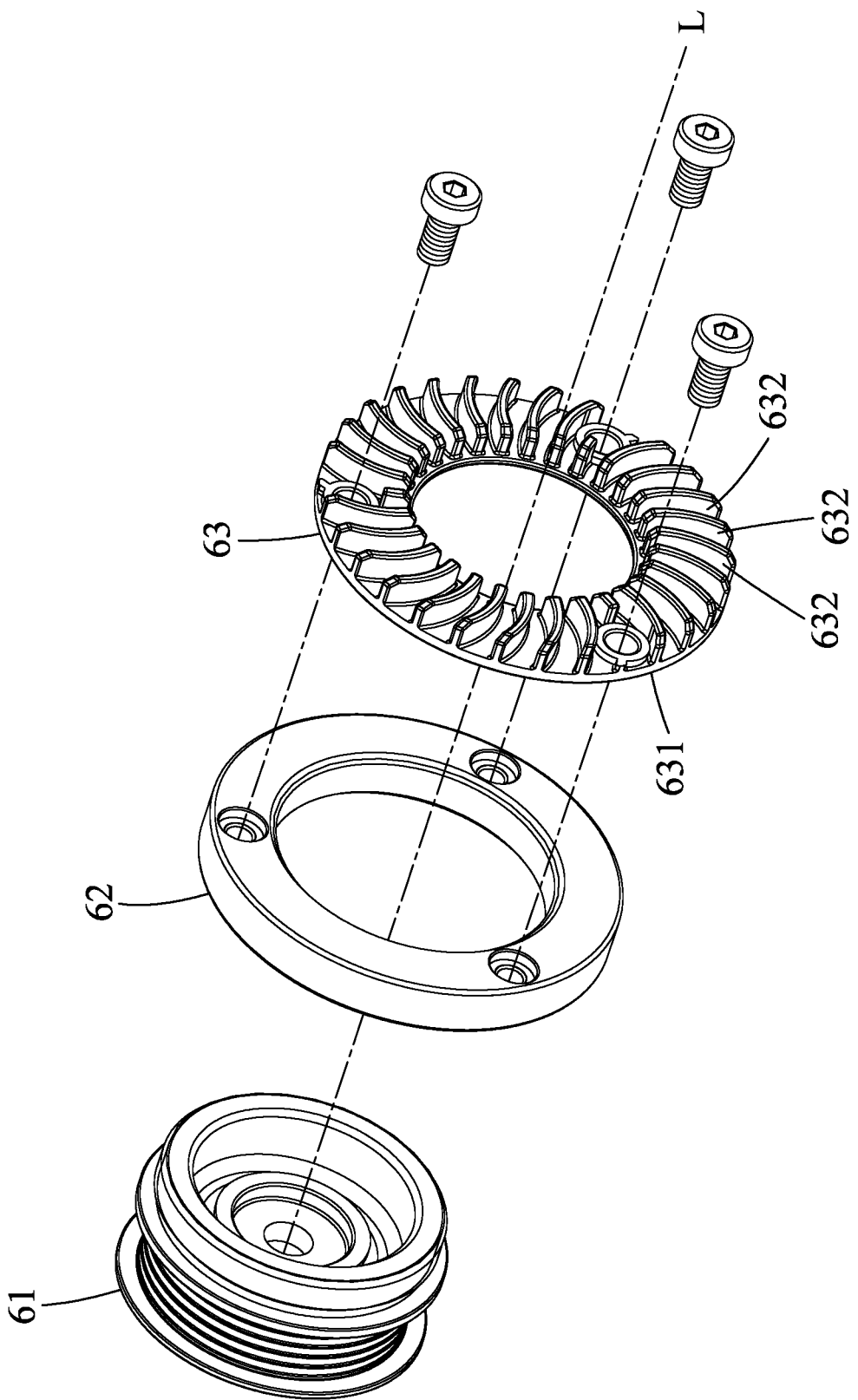
FIG. 2 is an exploded perspective view illustrating a head dissipating device of the embodiment.
Figure 3:
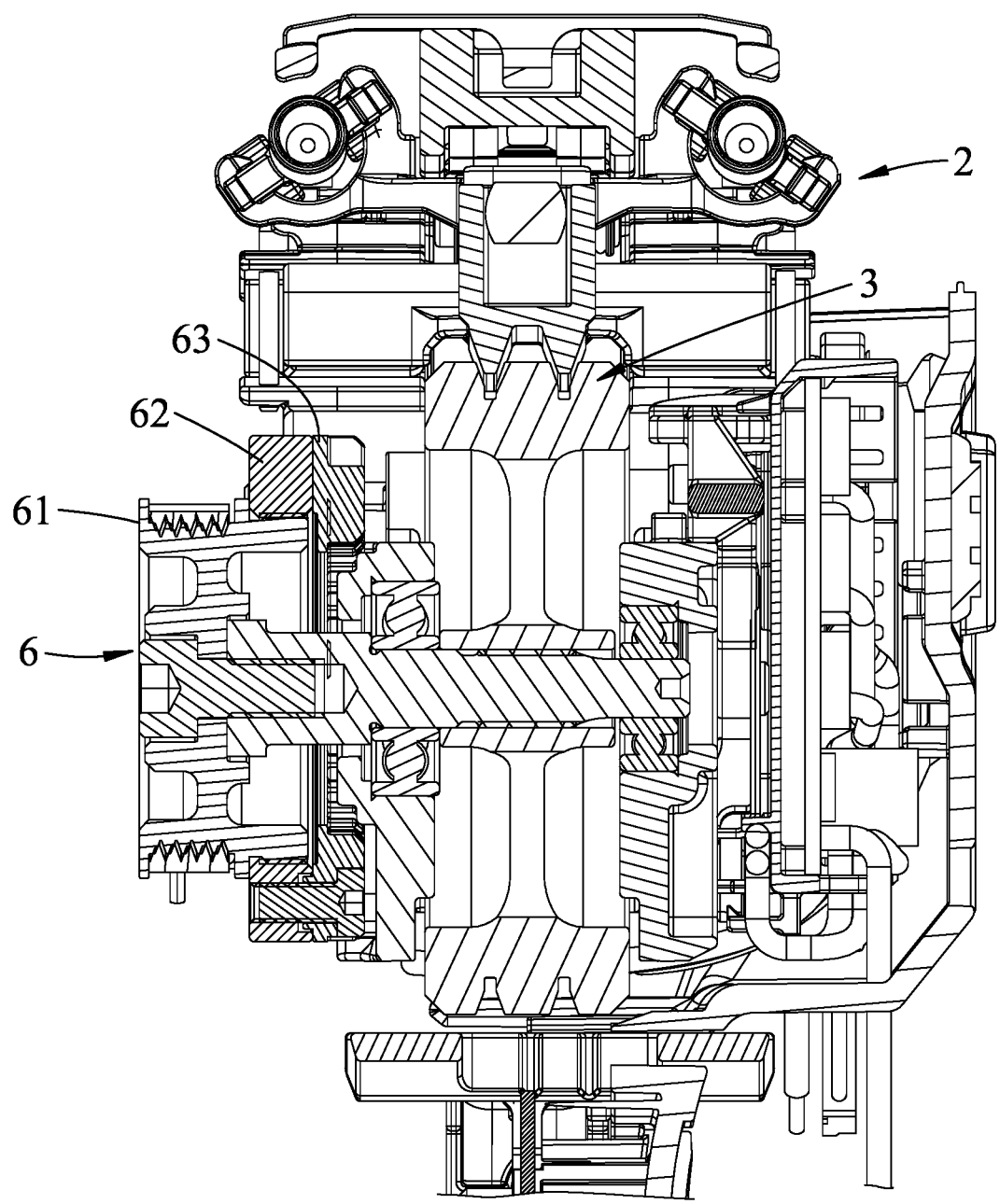
FIG. 3 is a fragmentary sectional view of the embodiment.

Referring to FIGS. 1, 2 and 3, an embodiment of an electric nail gun according to the disclosure includes a main frame 2, a flywheel 3, a first pulley 4, a transmission belt 5 and a heat dissipating device 6.

The flywheel 3 is mounted to the main frame 2 and is rotatable about an axis (L).

The first pulley 4 is mounted to the main frame 2, is spaced apart from the flywheel 3, and is adapted to be driven by electric power to rotate.

The transmission belt 5 is trained on the first pulley 4 for power transmission.

The heat dissipating device 6 is connected between the transmission belt 5 and the flywheel 3, and includes a second pulley 61, a weight disc 62 and a heat dissipating member 63.

The second pulley 61 is connected coaxially and co-rotatably to the flywheel 3. The transmission belt 5 is further trained on the second pulley 61 such that the second pulley 61 may be driven rotatably by the first pulley 4 to thereby drive rotation of the flywheel 3 about the axis (L).

The weight disc 62 is connected coaxially and co-rotatably to the second pulley 61, and the heat dissipating member 63 is connected coaxially and co-rotatably to the weight disc 62. As such, rotation of the first pulley 4 drives co-rotation of the second pulley 61, the flywheel 3, the weight disc 62 and the heat dissipating member 63.

Specifically, the heat dissipating member 63 includes a base disc 631 and a plurality of fan blades 632. The base disc 631 is disposed between the weight disc 62 and the flywheel 3. Each of the fan blades 632 extends in a direction of the axis (L) from the base disc 631 towards the flywheel 3. During co-rotation of the flywheel 3, the weight disc 62 and the heat dissipating member 63, the fan blades 632 create a flow of air for cooling the flywheel 3.

In the present embodiment, the second pulley 61, the weight disc 62 and the heat dissipating member 63 are arranged sequentially with the flywheel 3 along the axis (L) with the heat dissipating member 63 and the second pulley 61 being respectively proximate to and distal from the flywheel 3, and the weight disc 62 and the heat dissipating member 63 are fastened together by screws.

It should be noted that a cross section of each of the fan blades 632 perpendicular to the direction of the axis (L) is arc-shaped, which enables the fan blades 632 to direct air in a more focused manner towards the flywheel 3.

Figure 4:
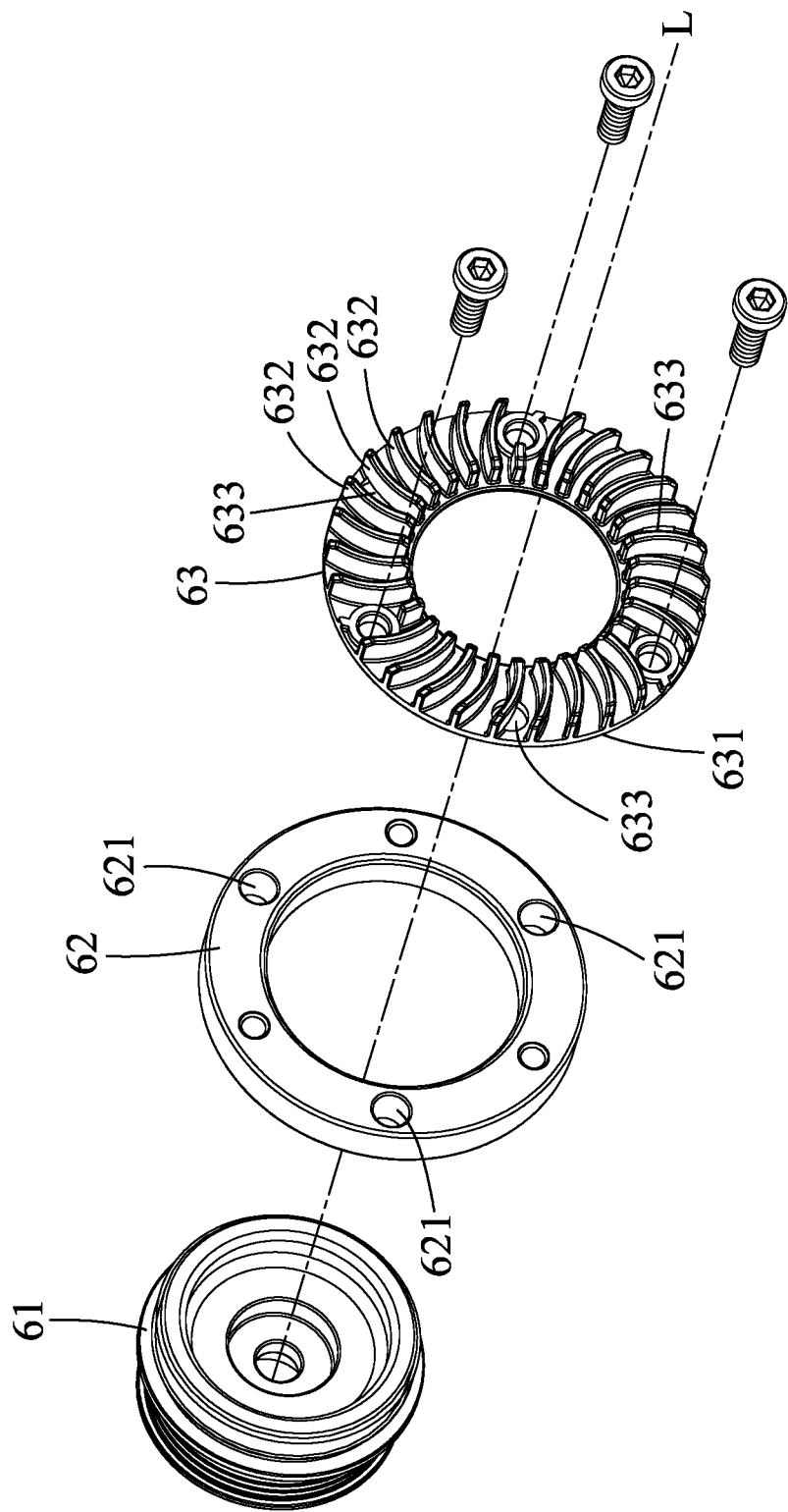
FIG. 4 is an exploded perspective view illustrating a variation of the heat dissipating device of the embodiment.

Referring to FIG. 4, in a variation of the embodiment, the weight disc 62 is formed with a plurality of air holes 621 that extend therethrough in the direction of the axis (L), and the base disc 631 is formed with a plurality of openings 633 that also extend therethrough in the direction of the axis (L). Each of the openings 633 of the base disc 631 is in spatial communication with a corresponding one of the air holes 621 of the weight disc 62 such that the air holes 621 and the openings 633 cooperatively form a plurality of air passages, which allow ambient air drawn by the fan blades 632 to flow therethrough, and thereby facilitate the cooling process.

Figure 5:
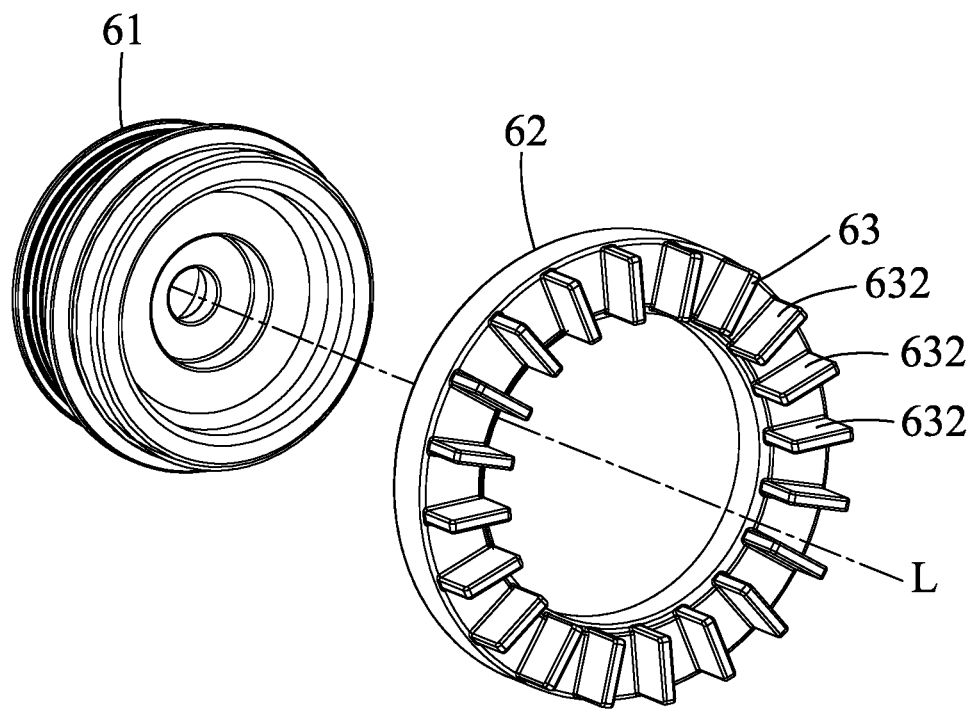
FIG. 5 is a partly exploded perspective view illustrating another variation of the head dissipating device of the embodiment.

Referring to FIG. 5, in another variation of the embodiment, the base disc 631 is omitted and the weight disc 62 and the heat dissipating member 63 are molded as one piece. That is, each of the fan blades 632 extends directly from the weight disc 62 towards the flywheel 3 in the direction of the axis (L). In addition, the fan blades 632 are straight instead of arc-shaped in the present variation.

Referring again to FIGS. 1, 2 and 3, in summary, the embodiment of the electric nail gun according to the disclosure has the following advantages.

Firstly, by virtue of coaxial arrangement of the heat dissipating member 63 and the second pulley 61 and the configuration of the fan blades 632, addition of the weight disc 62 is allowed and, compared with the prior art, the present embodiment provides a more flexible design; if desired, the output power of the electric nail gun can be increased by the addition of the weight disc 62 without sacrificing the cooling effect of the heat dissipating member 63.

Secondly, in virtue of the air passages defined by the air holes 621 and the openings 633, the ambient air drawn by the fan blades 632 is allowed to flow therethrough to facilitate the cooling process.

Finally, since the second pulley 61, the weight disc 62 and the heat dissipating device 63 can be either molded as one piece or configured as separate components, the electric nail gun of the present disclosure is rather flexible to meet different requirements.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A heat dissipating device adapted to be mounted in an electric nail gun, the electric nail gun including a main frame, a flywheel that is mounted to the main frame and that is rotatable about an axis, a first pulley that is rotatably mounted to the main frame and that is spaced apart from the flywheel, and a transmission belt that is trained on the first pulley, said heat dissipating device comprising:
   a second pulley adapted to be connected coaxially and co-rotatably to the flywheel, and adapted to be trained by the transmission belt, such that said second pulley is adapted to be driven rotatably by the first pulley to thereby drive rotation of the flywheel about the axis;
   a weight disc adapted to be connected coaxially and co-rotatably to said second pulley; and
   a heat dissipating member connected coaxially and co-rotatably to said weight disc, and including a reference surface normal to the axis and a plurality of fan blades, each of said fan blades extending perpendicularly from said reference surface in a direction of the axis away from said weight disc such that, during co-rotation of the flywheel, said weight disc and said heat dissipating member, said fan blades create a flow of air for cooling the flywheel.

2. The heat dissipating device as claimed in claim 1, wherein said second pulley, said weight disc and said heat dissipating member are arranged sequentially with the flywheel along the axis with said heat dissipating member and said second pulley being adapted to be respectively proximate to and distal from the flywheel.

3. The heat dissipating device as claimed in claim 1, wherein said weight disc and said heat dissipating member are molded as one piece, said heat dissipating member being adapted to be disposed between said weight disc and the flywheel, each of said fan blades being adapted to extend towards the flywheel.

4. The heat dissipating device as claimed in claim 1, wherein said heat dissipating member further includes a base disc having said reference surface and adapted to be disposed between said weight disc and the flywheel, each of said fan blades being adapted to extend from said base disc towards the flywheel.

5. The heat dissipating device as claimed in claim 1, wherein a cross section of each of said fan blades perpendicular to the direction of the axis is arc-shaped.

6. The heat dissipating device as claimed in claim 1, wherein said weight disc is formed with a plurality of air holes that extend therethrough in the direction of the axis.

7. The heat dissipating device as claimed in claim 6, wherein said heat dissipating member further includes a base disc that has said reference surface, that is adapted to be disposed between said weight disc and the flywheel and that is formed with a plurality of openings, each of said openings being in spatial communication with a corresponding one of said air holes of said weight disc, each of said fan blades being adapted to extend from said base disc towards the flywheel.

8. An electric nail gun comprising:
   a main frame;
   a flywheel that is mounted to said main frame and that is rotatable about an axis;
   a first pulley that is rotatably mounted to said main frame and that is spaced apart from said flywheel;
   a transmission belt that is trained on said first pulley; and a heat dissipating device as claimed in claim 1 that is connected between said transmission belt and said flywheel.

9. The electric nail gun as claimed in claim 8, wherein said second pulley, said weight disc, said heat dissipating member and said flywheel are arranged sequentially along the axis with said heat dissipating member and said second pulley being respectively proximate to and distal from said flywheel.

10. The electric nail gun as claimed in claim 8, wherein said weight disc and said heat dissipating member are molded as one piece, said heat dissipating member being disposed between said weight disc and said flywheel, each of said fan blades extending towards said flywheel.

11. The electric nail gun as claimed in claim 8, wherein said heat dissipating member further includes a base disc having said reference surface and disposed between said weight disc and said flywheel, each of said fan blades extending from said base disc towards said flywheel.

12. The electric nail gun as claimed in claim 8, wherein a cross section of each of said fan blades perpendicular to the direction of the axis is arc-shaped.

13. The electric nail gun as claimed in claim 8, wherein said weight disc is formed with a plurality of air holes that extend therethrough in the direction of the axis.

14. The electric nail gun as claimed in claim 13, wherein said heat dissipating member further includes a base disc that has said reference surface, that is disposed between said weight disc and said flywheel and that is formed with a plurality of openings, each of said openings being in spatial communication with a corresponding one of said air holes of said weight disc, each of said fan blades extending from said base disc towards said flywheel.

* * * * *